United States Patent
Ge et al.

(10) Patent No.: US 9,190,343 B1
(45) Date of Patent: Nov. 17, 2015

(54) SEMICONDUCTOR DEVICE WITH TUBE BASED HEAT SPREADER

(71) Applicants: You Ge, Tianjin (CN); Meng Kong Lye, Shah Alam (MY); Zhijie Wang, Tianjin (CN)

(72) Inventors: You Ge, Tianjin (CN); Meng Kong Lye, Shah Alam (MY); Zhijie Wang, Tianjin (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/555,565

(22) Filed: Nov. 26, 2014

(30) Foreign Application Priority Data

Jul. 16, 2014 (CN) .......................... 2014 1 0337693

(51) Int. Cl.
| H01L 23/34 | (2006.01) |
| H01L 21/50 | (2006.01) |
| H01L 23/433 | (2006.01) |
| H01L 21/56 | (2006.01) |

(52) U.S. Cl.
CPC ............ *H01L 23/4334* (2013.01); *H01L 21/56* (2013.01)

(58) Field of Classification Search
CPC ................................ H01L 23/34; H01L 21/50
USPC ........................................................ 257/712
See application file for complete search history.

(56) References Cited

U.S. PATENT DOCUMENTS

| 4,535,384 | A | 8/1985 | Wakabayashi |
| 6,654,248 | B1 | 11/2003 | Fishley |
| 6,734,552 | B2 | 5/2004 | Combs |
| 7,015,072 | B2 | 3/2006 | Combs |
| 7,163,845 | B2 | 1/2007 | Prindiville |
| 7,280,572 | B2 | 10/2007 | Honda |
| 7,608,915 | B2 | 10/2009 | Liao |
| 7,737,550 | B2 | 6/2010 | MacQuarrie |
| 8,013,440 | B2 | 9/2011 | Warren |
| 2008/0225484 | A1* | 9/2008 | Brodsky et al. ................ 361/699 |
| 2009/0059537 | A1 | 3/2009 | Mac Quarrie |
| 2012/0247743 | A1 | 10/2012 | Nimi |
| 2014/0239483 | A1* | 8/2014 | Hata .............................. 257/712 |

FOREIGN PATENT DOCUMENTS

JP 08888663 * 8/1996 .............. H01L 23/36

* cited by examiner

*Primary Examiner* — Marc Armand
(74) *Attorney, Agent, or Firm* — Charles Bergere

(57) ABSTRACT

A packaged semiconductor device having an integrated circuit (IC) die, a flexible tube, and a metal slug. During assembly, a first end of the tube is mounted on a surface of the IC die and a second end of the tube extends away from the die surface. The exposed portions of the surface of the IC die are encased in a molding compound, which also encases the perimeter of the tube. After molding, the tube may be filled with metal to improve conduction of heat away from the die top. If the tube is formed of a soft material like rubber then the tube will not damage the die top during attachment thereto.

18 Claims, 2 Drawing Sheets

CROSS-SECTION B-B

SEMICONDUCTOR DEVICE WITH TUBE BASED HEAT SPREADER

BACKGROUND

The present invention relates generally to semiconductor packaging, and more particularly, to a semiconductor package with a tube-based heat spreader.

With the miniaturization of integrated circuits, heat removal has become more important. If heat is not adequately dissipated from an integrated circuit die, then the integrated circuit could overheat, resulting in decreased performance and possibly even failure. To help dissipate heat, some conventional packaged semiconductor devices are configured with heat spreaders. In general, a heat spreader disperses heat emitted from an integrated circuit to an area of the package that is away from the integrated circuit.

Heat spreaders are usually made of metal such as copper because of its good thermal characteristics. Typically one end or side of the heat spreader is attached to a surface of the die and the other end or side of the heat spreader is exposed. However, since the heat spreader comprises metal, when it is attached to the die top, it can damage the die and the underlying integrated circuit. Thus, it would be advantageous to have a heat spreader that is less likely to damage the die top when attached thereto.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the present invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures. For example, two figures shown in succession may in fact be executed substantially concurrently or may sometimes be executed in the reverse order, depending upon the functionality/acts involved.

In the following description, it will be understood that certain embodiments of the present invention are related to the use of metal-filled tubes within packaged semiconductor devices for heat dissipation. For ease of discussion, the assembly of one exemplary packaged semiconductor device is described below. However, it will be understood that embodiments of the present invention are not limited to a particular configuration of the tubes or the particular package type (wire bonded or flip chip).

One embodiment of the present invention is a packaged semiconductor device comprising an integrated circuit (IC) die, a soft, flexible tube, and a metal filler. The device comprises a first end of the tube mounted onto a surface of the IC die and a second end of the tube extending away from the surface of the IC die. The metal filler is disposed within the tube. Another embodiment of the present invention is method for assembling the packaged semiconductor device.

Figure 1A:
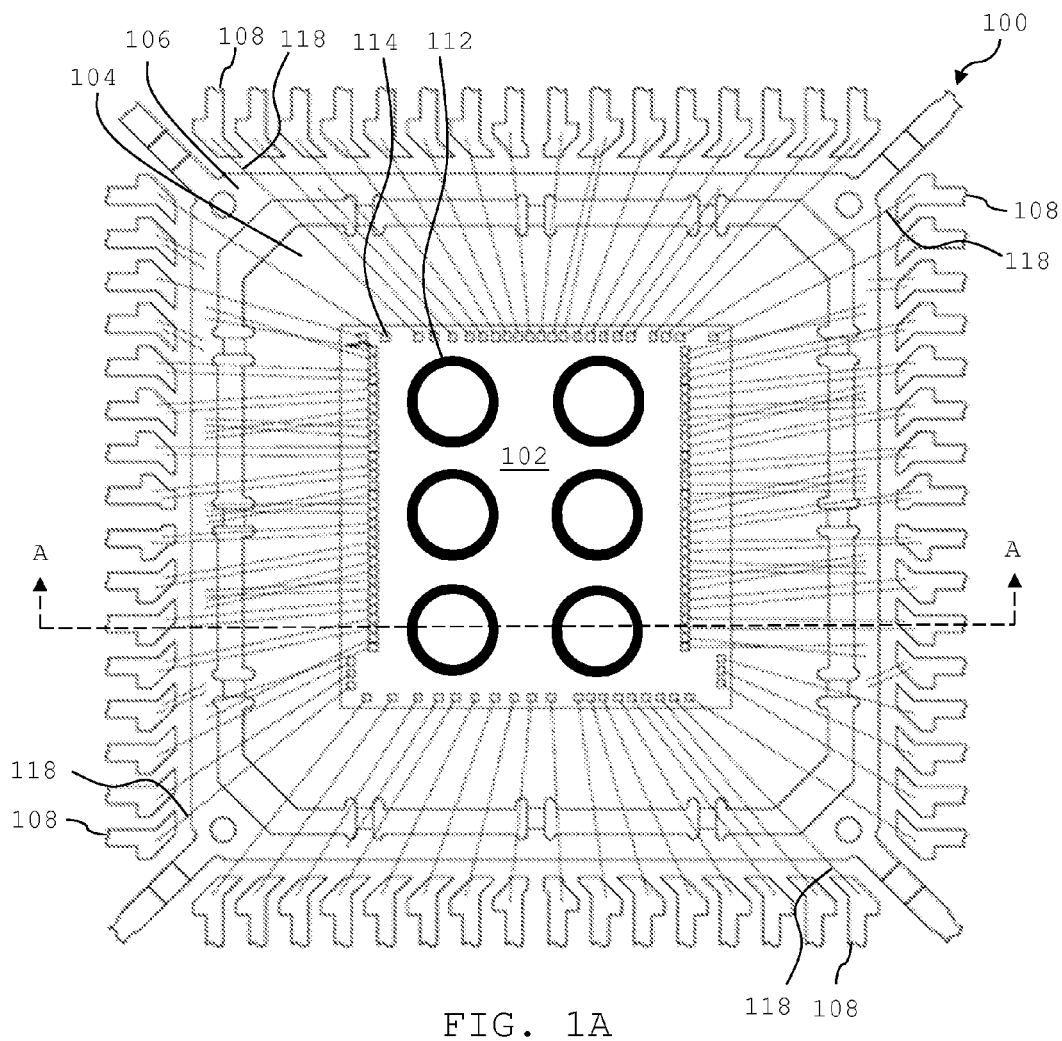
FIGS. 1A and 1B show top and cross-sectional side views, respectively, of a partially-assembled semiconductor package according to one embodiment of the present invention.
Figure 1B:
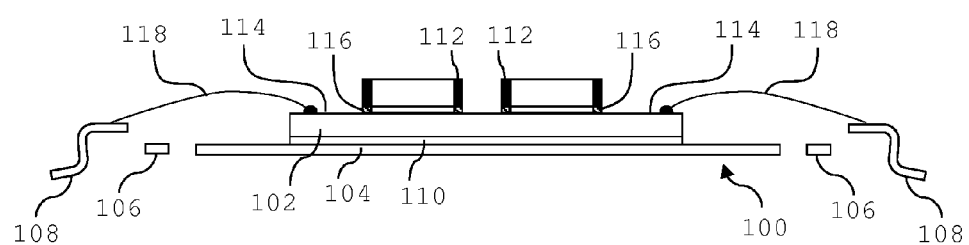

Referring now to FIGS. 1A and 1B, top and cross-sectional side views, respectively, of a partially-assembled semiconductor package according to one embodiment of the present invention are shown. In this embodiment, the packaged semiconductor device is implemented as a quad-flat package (QFP). The partially-assembled semiconductor package comprises a metal lead frame 100 and an integrated circuit (IC) die 102. Methods of fabricating the lead frame 100 and the IC die 102 are well known and therefore not described herein.

The lead frame 100 comprises a die paddle 104 (sometimes referred to as a die flag or pad) with a ground bar 106, which is formed around a periphery of the die paddle 104 and is physically and electrically isolated from the die paddle 104. The lead frame 100 also comprises a plurality of lead fingers 108 that surround the ground bar 106 along the periphery of the lead frame 100. Embodiments of the present invention need not include the ground bar 106.

Although not shown, the lead frame 100 may comprise metal connecting elements (sometimes referred to as lead frame runners) that connect the distal ends of the lead fingers 108 to one another. These metal runners may also connect the lead frame 100 to one or more other instances (not shown) of the lead frame 100 such that the instances of lead frames form a one- or two-dimensional array of interconnected lead frames.

During assembly of the packaged semiconductor device, the IC die 102 is mounted on the die paddle 104 using a die-attach adhesive 110, as shown in cross-sectional view A-A of FIG. 1B and as known in the art. A plurality of tubes 112 are then mounted on the active surface of the IC die 102 but in such a way that they do not interfere with bond pads 114 formed on the active surface of the IC die 102. Bond wires 118 are strung between the bond pads 114 on the IC die 102 and a plurality of the lead fingers 108. As shown in FIG. 1A, but not in FIG. 1B, other bond wires 118 connect other die bond pads 114 to the ground bar 106, and still other bond wires connect the ground bar 106 to certain ones of the lead fingers 108.

Each tube 112 may be mounted on the surface of the die 102 by applying an adhesive 116, such as (without limitation) an epoxy, to one end of the tube 112, and pressing the tube end with the adhesive 116 onto the active surface of the IC die 102. Tubes 112 may be placed in a variety of locations on the surface of the die 102, such as in an array formation. In at least some embodiments of the present invention, the particular locations at which the tubes 112 are placed may be determined using, for example, a thermal simulation that identifies the hottest area or areas on the IC die 102 when the die is operating. Further, application of the adhesive 116 may be controlled to prevent the adhesive 116 from bleeding onto areas of the IC die 102 that are not directly below the wall of the tube 112.

In at least some embodiments of the present invention, the tubes 112 are fabricated from a flexible, and preferably soft material such as (without limitation) rubber or silicone, although other materials such as Teflon could be used. The flexible material may be selected such that, when the tube 112 is mounted onto the IC die 102, the flexibility or softness of the tube 112 reduces the likelihood of damage to the surface of the IC die 102. In addition, in at least some embodiments of the present invention, the tubes 112 are fabricated from a material that is capable of enduring high temperatures. The tubes 112 may be round (i.e., cylindrical) or square. A diameter of the tube 112 may be, for example, 2-4 mm, but the size can range from 1mm to 20 mm depending on the size of the die 102. The height of the tube 112 will depend on the overall desired package dimensions so may range from, for example, 0.4 mm to about 1.8 mm.

Figure 2A:
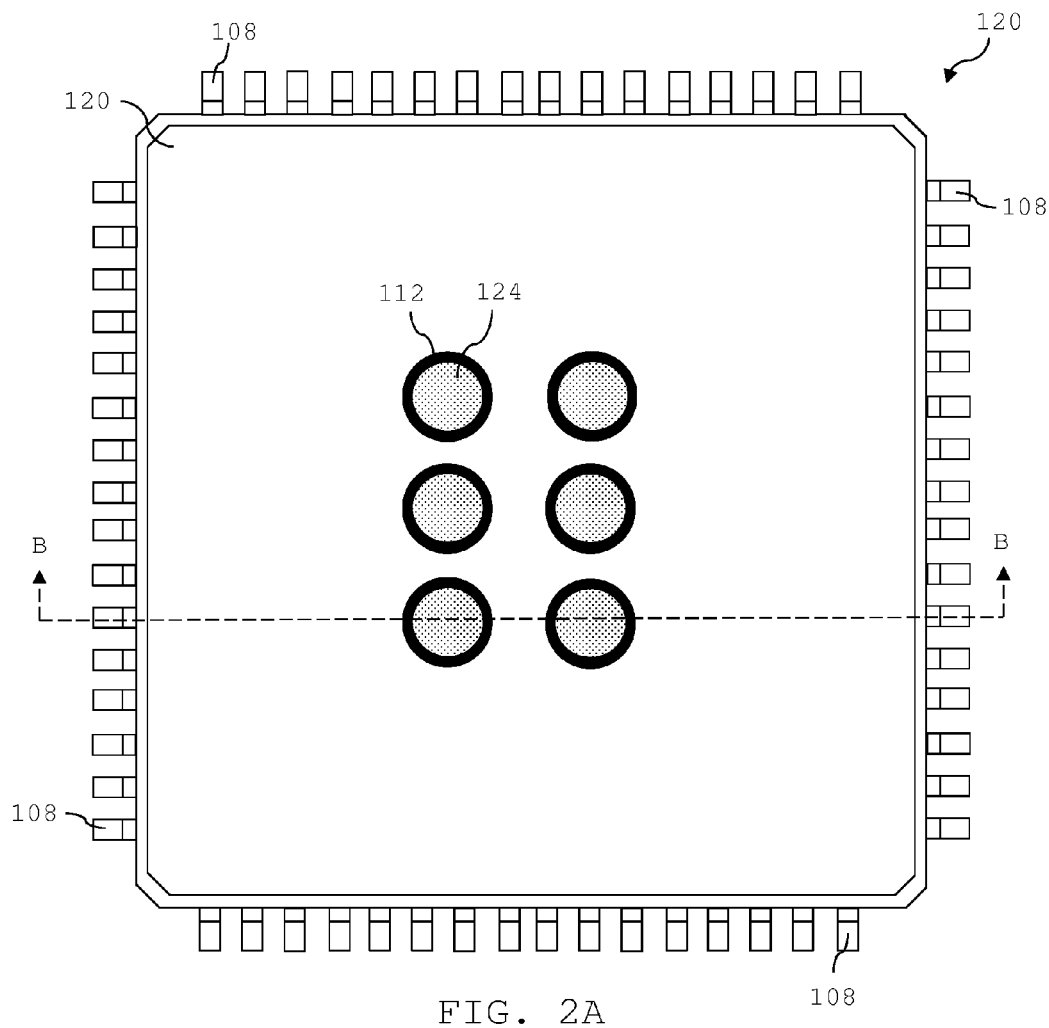
FIGS. 2A and 2B show top and cross-sectional side views, respectively, of a fully-assembled semiconductor package according to one embodiment of the present invention.
Figure 2B:
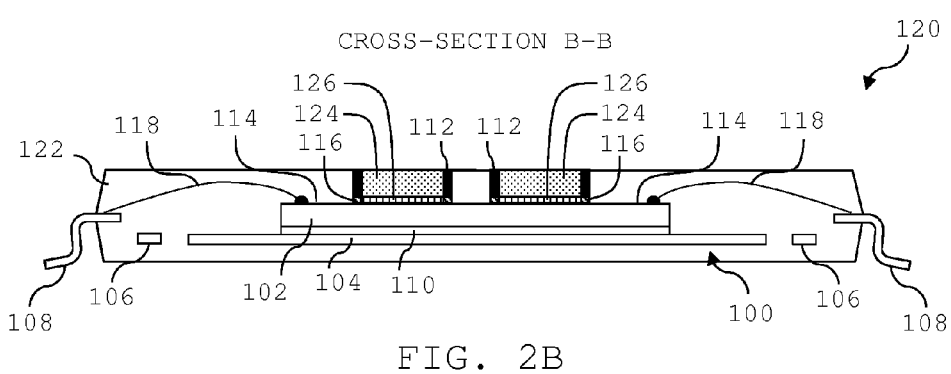

FIGS. 2A and 2B show top and cross-sectional side views, respectively, of a fully assembled semiconductor package 120 according to one embodiment of the present invention. To complete packaged semiconductor device 120, molding compound 122 is applied to the partially-assembled semiconductor package of FIGS. 1A and 1B. The molding compound 122, which may be applied by the nozzle of a conventional dispensing machine (not shown), covers the bond wires 118, the proximal ends of the lead fingers 108 (i.e., the ends of the lead fingers 108 near to the die paddle 104), the ground bar 106, the exposed portions of the IC die 102, and the exposed portions of the die paddle 104. Further, the molding compound 122 covers the curved perimeter of each tube 112, without filling the cavity within the tube 112 or covering the opening at the end of the tube 112 that is spaced from the die 102. Note that each tube 112 may be designed (e.g., by selecting the material and dimensions of the tube 112) such that the tube 112 substantially maintains the cavity formed therein while the molding compound is dispensed. In other words, the tubes 112 will not substantially collapse under the pressure of the molding compound 122.

When dispensing the mold compound 122, a mold (not shown) may be pressed onto the top ends of the tubes 112 to seal the cavities of the tubes 112. Then, when the molding compound 122 is dispensed, the molding compound 122 is prevented from entering the cavities of the tubes 112. Pressing the mold against the tubes 112 creates a downward force against the tubes 112, which in turn, applies the downward force to the top of the IC die 102. In embodiments in which the tubes 112 are fabricated using flexible material, the flexible material may compress such that the amount of force that is exerted onto the top of the IC die 102 is reduced. This compression may reduce the likelihood of damage to the IC die 102.

After molding, the tube 112 is filled with a thermally conductive material, such as a solid, metal slug 124 or a metal material such as metal particles mixed with an adhesive. In one embodiment, a metal slug 124 is mounted within each tube 112 by pressing the metal slug 124 down into the top end of the tube 112 using a pick and place machine. The metal slug 124 is held in place using an adhesive 126, which may be dispensed onto one or both of the metal slug 124 and the upper surface of the IC die 102 within the cavity of the corresponding tube 112. In at least some embodiments, the adhesive 126 is a thermal adhesive that is suitable for securing the metal slug 124 and conducting the heat emitted from the IC die 102 to the metal slug 124.

After filling the tube 112 with the metal slug 124 and covering the die 102, bond wires 118, etc. with the molding compound 122, laser or saw singulation and/or trimming may be performed to remove any metal connecting elements (not shown) to (i) electrically and mechanically de-couple the lead fingers 108 from one another and (ii) separate the packaged semiconductor device 120 from other packaged semiconductor devices assembled on adjacent, interconnected lead frames (not shown).

Although one embodiment of the present invention was described relative to its use with a QFP having a particular configuration, embodiments of the present invention are not so limited. According to alternative embodiments, the present invention may be implemented in QFPs having configurations other than that shown and in other types of packages including (without limitation) packages in which the bottom side of the die paddle is exposed (i.e., not covered in molding compound), packages that have balls or pins, packages that do not have metal lead frames, and packages that electrically connect IC dies to leads without using bond wires (e.g., using redistribution layers located below the IC dies).

Further, although one embodiment of the present invention was shown in which six equally-sized cylindrical tubes were mounted onto an IC die, embodiments of the present invention are not so limited. For example, alternative embodiments of the present invention may employ as few as one tube or more than six tubes.

As another example, alternative embodiments of the present invention may employ tubes having non-circular cross-sections, including (without limitation) square, triangular, ovular, and other closed-shape cross-sections.

As yet another example, alternative embodiments of the present invention may employ tubes having different sizes than that shown. For instance, a packaged semiconductor device of the present invention may be implemented with a single large tube having a cross-section that occupies a substantial portion of the IC die surface or multiple tubes having mutually different sizes and/or shapes.

As even yet another example, alternative embodiments of the present invention may employ tubes that are not spaced apart.

Although one embodiment was described in which a packaged semiconductor device is assembled by pressing solid metal slugs into tubes, embodiments of the present invention are not so limited. According to alternative embodiments of the present invention, packaged semiconductor devices can be assembled by dispensing powdered metal, liquid metal, or metal paste into the tubes. The powdered metal, liquid metal, or metal paste may then be solidified with or without heating as needed.

According to yet further embodiments, the solid metal slugs could be secured in the tubes without, or in addition to, using adhesive (e.g., by press-fitting the solid metal slugs into the tubes).

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Terms of orientation such as "lower," "upper," "horizontal," "vertical," "above," "below," "up," "down," "top," "bottom," "right," and "left" well as derivatives thereof (e.g., "horizontally," "vertically," etc.) should be construed to refer to the orientation as shown in the drawing under discussion. These terms of orientation are for convenience of description and do not require that the apparatus be constructed or operated in a particular orientation.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

It should be understood that the steps of the exemplary methods set forth herein are not necessarily required to be performed in the order described, and the order of the steps of such methods should be understood to be merely exemplary. For example, the tubes 112 could be mounted after wire bonding and/or the metal slug 124 could be installed before molding. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

The invention claimed is:

1. A packaged semiconductor device, comprising:
    an integrated circuit (IC) die;
    a tube having a first end mounted on a surface of the IC die, a second end extending away from the surface of the IC die, and a cavity formed by a wall of the tube and the surface of the IC die; and
    a conductive material that fills the cavity of the tube, wherein the conductive material moves heat from the IC die to an exterior of the packaged semiconductor device.

2. The packaged semiconductor device of claim 1, wherein the tube is fabricated from a soft, flexible material.

3. The packaged semiconductor device of claim 2, the tube comprises one or more of rubber and silicone.

4. The packaged semiconductor device of claim 1, wherein the tube is substantially cylindrical.

5. The packaged semiconductor device of claim 1, wherein the tube is substantially perpendicular to the surface of the IC die.

6. The packaged semiconductor device of claim 1, further comprising an adhesive that secures the conductive material to the surface of the IC die.

7. The packaged semiconductor device of claim 6, wherein the conductive material comprises metal particles and the adhesive is mixed with the metal particles.

8. The packaged semiconductor device of claim 1, further comprising:
    one or more additional tubes, each comprising a first end mounted on a surface of the IC die and a second end extending away from the surface of the IC die; and
    additional conductive material that fills the additional tubes.

9. The packaged semiconductor device of claim 1, further comprising molding compound encasing (i) an outer perimeter of the tube, without covering the second end of the tube, and (ii) at least a portion of the surface of the IC die.

10. A packaged semiconductor device, comprising:
    an integrated circuit (IC) die;
    a soft, flexible tube having a first end mounted on a surface of the IC die, a second end extending away from the surface of the IC die, and a cavity formed by a wall of the tube and the surface of the IC die;
    a thermally conductive material that fills the cavity of the tube, wherein the conductive material moves heat from the IC die to an exterior of the packaged semiconductor device;
    an adhesive that secures the conductive material to the surface of the IC die; and
    molding compound encasing (i) an outer perimeter of the tube, without covering the second end of the tube, and (ii) at least a portion of the surface of the IC die.

11. The packaged semiconductor device of claim 10, wherein the conductive material comprises metal particles and the adhesive is mixed with the metal particles.

12. A method for assembling a packaged semiconductor device, the method comprising:
    (a) mounting a first end of a tube onto a surface of an IC die such that a second end of the tube extends away from the surface and a cavity is formed by a wall of the tube and the surface of the IC die; and
    (b) filling the cavity of the tube with a thermally conductive material, wherein the thermally conductive material moves heat from the die to outside of the packaged semiconductor device.

13. The method of claim 12, wherein the tube is fabricated from a soft, flexible material.

14. The method of claim 13, the tube comprises one or more of rubber and silicone.

15. The method of claim 12, wherein:
    step (a) further comprises mounting a first end of an additional tube on the surface of the IC die such that a second end of said additional tube extends away from the surface and a cavity of said additional tube is formed by a wall of said additional tube and the surface of the IC die; and
    step (b) further comprises filling said additional tube with additional thermally conductive material.

16. The method of claim 12, wherein the tube is substantially cylindrical and perpendicular to the die surface.

17. The method of claim 12, wherein step (b) comprises:
    combining the thermally conductive material with an adhesive so that the thermally conductive material adheres to the surface of the IC die.

18. The method of claim 12, further comprising encapsulating in a molding compound (i) an outer perimeter of the tube, without covering the second end of the tube, and (ii) at least a portion of the surface of the IC die.

\* \* \* \* \*